US010153269B2

(12) United States Patent
Strachan et al.

(10) Patent No.: US 10,153,269 B2
(45) Date of Patent: *Dec. 11, 2018

(54) LOW DYNAMIC RESISTANCE LOW CAPACITANCE DIODES (71) Applicant: Texas Instruments Incorporated, Dallas, TX (US)

(72) Inventors: Andrew D. Strachan, Santa Clara, CA (US); Alexei Sadovnikov, Sunnyvale, CA (US); Gang Xue, San Jose, CA (US); Dening Wang, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/679,592

(22) Filed: Aug. 17, 2017

(65) Prior Publication Data

US 2017/0345813 A1 Nov. 30, 2017

Related U.S. Application Data (63) Continuation of application No. 14/991,881, filed on Jan. 8, 2016, now Pat. No. 9,773,777.

(51) Int. Cl.
H01L 27/02 (2006.01)
H01L 29/06 (2006.01)
(Continued)

(52) U.S. Cl.
CPC ...... H01L 27/0255 (2013.01); H01L 29/0623 (2013.01); H01L 29/0649 (2013.01);
(Continued)

(58) Field of Classification Search
CPC ............ H01L 27/0255; H01L 29/0623; H01L 29/66113; H01L 29/8618; H01L 29/1095;
(Continued)

(56) References Cited

U.S. PATENT DOCUMENTS 5,870,268 A 2/1999 Lin et al.
6,677,643 B2 1/2004 Iwamoto et al.
(Continued)

OTHER PUBLICATIONS

Notification of Transmittal of the International Search Report and the Written Opinion of the International Searching Authority, or the Declaration; dated May 4, 2017.

Primary Examiner — Steven Loke
Assistant Examiner — Juanita Rhodes
(74) Attorney, Agent, or Firm — Andrew R. Ralston; Charles A. Brill; Frank D. Cimino (57) ABSTRACT A low dynamic resistance, low capacitance diode of a semiconductor device includes a heavily-doped n-type substrate. A lightly-doped n-type layer 1 micron to 5 microns thick is disposed on the n-type substrate. A lightly-doped p-type layer 3 microns to 8 microns thick is disposed on the n-type layer. The low dynamic resistance, low capacitance diode, of the semiconductor device includes a p-type buried layer, with a peak dopant density above $1 \times 10^{17}$ cm$^{-3}$, extending from the p-type layer through the n-type layer to the n-type substrate. The low dynamic resistance, low capacitance diode also includes an n-type region disposed in the p-type layer, extending to a top surface of the p-type layer.

20 Claims, 7 Drawing Sheets (51) Int. Cl.
*H01L 29/861* (2006.01)
*H01L 29/66* (2006.01)

(52) U.S. Cl.
CPC .... *H01L 29/6609* (2013.01); *H01L 29/66113* (2013.01); *H01L 29/861* (2013.01); *H01L 29/8618* (2013.01)

(58) Field of Classification Search
CPC ............ H01L 29/7813; H01L 29/0649; H01L 29/407; H01L 29/7397; H01L 27/0288; H01L 21/761; H01L 27/0629; H01L 21/2253; H01L 29/861; H01L 29/8611
See application file for complete search history.

(56) References Cited

U.S. PATENT DOCUMENTS

| | | |
|---|---|---|
| 7,525,779 B2 | 4/2009 | Chen et al. |
| 7,728,382 B2 | 6/2010 | Tsuzuki et al. |
| 8,377,757 B2 | 2/2013 | Hawe et al. |
| 2004/0201044 A1 | 10/2004 | Diefenbeck et al. |
| 2005/0286186 A1 | 12/2005 | Chang |
| 2008/0197446 A1 | 8/2008 | Disney et al. |
| 2010/0314660 A1 | 12/2010 | Salih et al. |
| 2012/0299052 A1 | 11/2012 | Mauder et al. |
| 2012/0299053 A1* | 11/2012 | Mauder ............... H01L 29/0615 257/139 |
| 2013/0299849 A1* | 11/2013 | Tega ................... H01L 29/0607 257/77 |
| 2014/0097489 A1* | 4/2014 | Roig-Guitart ....... H01L 29/0646 257/330 |
| 2015/0048382 A1* | 2/2015 | Takeuchi ............ H01L 29/4236 257/77 |
| 2015/0364562 A1 | 12/2015 | Hokomoto et al. |

* cited by examiner

LOW DYNAMIC RESISTANCE LOW CAPACITANCE DIODES

CROSS-REFERENCE TO RELATED APPLICATIONS

Under 35 U.S.C. § 120, this continuation application claims benefits of and priority to U.S. patent application Ser. No. 14/991,881, filed on Jan. 8, 2016, the entirety of which are hereby incorporated herein by reference.

FIELD OF THE DISCLOSURE

This disclosure relates to the field of semiconductor devices. More particularly, this disclosure relates to diodes in semiconductor devices.

BACKGROUND OF THE DISCLOSURE

Diodes with low dynamic resistance and low capacitance are useful in electronic circuits, for example in electrostatic discharge (ESD) protection circuits. Low capacitance is attained by a lightly doped layer of a forward-biased diode in series with a reverse-biased diode; the reverse-biased diode has a heavily doped buried layer over the substrate which sets the breakdown voltage. It is desirable to minimize the dynamic resistance and capacitance of the diode, while providing a desired breakdown voltage. In some applications, the desired breakdown voltage may be 6 volts to 8 volts; in other applications, the desired breakdown voltage may be significantly higher, for example in the range of 20 volts to 40 volts. The dynamic resistance is limited by the conductivity of the substrate; increasing the dopant density in the substrate to improve the dynamic resistance disadvantageously reduces the breakdown voltage. Simultaneously attaining desired values of dynamic resistance and breakdown voltage has been problematic.

SUMMARY OF THE DISCLOSURE

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A semiconductor device includes an n-type substrate with a dopant density above $1\times10^{18}$ cm$^{-3}$. An n-type layer 1 micron to 5 microns thick, with a dopant density less than $1\times10^{16}$ cm$^{-3}$, is disposed on the n-type substrate. A p-type layer 3 microns to 8 microns thick, with a dopant density less than $1\times10^{15}$ cm$^{-3}$, is disposed on the n-type layer. A low dynamic resistance, low capacitance diode, referred to herein as the LR-LC diode of the semiconductor device, includes a p-type buried layer, with a peak dopant density above $1\times10^{17}$ cm$^{-3}$, extending from the p-type layer through the n-type layer to the n-type substrate. The LR-LC diode also includes an n-type region disposed in the p-type layer, extending to a top surface of the p-type layer.

A semiconductor device includes a first bidirectional diode and a second bidirectional diode in a back-to-back configuration. Each bidirectional diode includes an LR-LC diode and a parallel diode, separated by an isolation structure.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A semiconductor device includes an LR-LC diode. The semiconductor device has an n-type substrate. A lightly-doped n-type layer 1 micron to 5 microns thick is disposed on the n-type substrate. A lightly-doped p-type layer 3 microns to 8 microns thick is disposed on the n-type layer. The LR-LC diode includes a localized p-type buried layer, extending from the p-type layer through the n-type layer to the n-type substrate. The LR-LC diode also includes an n-type region, possibly an n-type well, disposed in the p-type layer, extending to a top surface of the p-type layer; the n-type region is separated from the buried p-type layer by at least 2 microns. A first pn junction at a boundary between the p-type buried layer and the n-type substrate sets a breakdown voltage of the LR-LC diode. A second pn junction at a boundary between the p-type layer and the n-type region sets a capacitance of the LR-LC diode.

The LR-LC diode may be part of a bidirectional diode which includes a parallel diode with a third pn junction between the p-type layer and the n-type layer. The parallel diode is free of any p-type buried layer. The LR-LC diode is laterally isolated from the parallel diode, for example by deep trench isolation structures; the LR-LC diode and the parallel diode share the n-type substrate. A first terminal of the bidirectional diode is coupled to the n-type region of the LR-LC diode and to the p-type layer of the parallel through a p-type region, possibly a p-type well, in the p-type layer above the n-type layer. A second terminal of the bidirectional diode may be coupled to the n-type substrate. A pair of the bidirectional diodes sharing the n-type substrate may have a back-to-back configuration, with a first external connection to the first terminal of a first bidirectional diode of the pair, and a second external connection to the first terminal of a second bidirectional diode of the pair.

Figure 1:
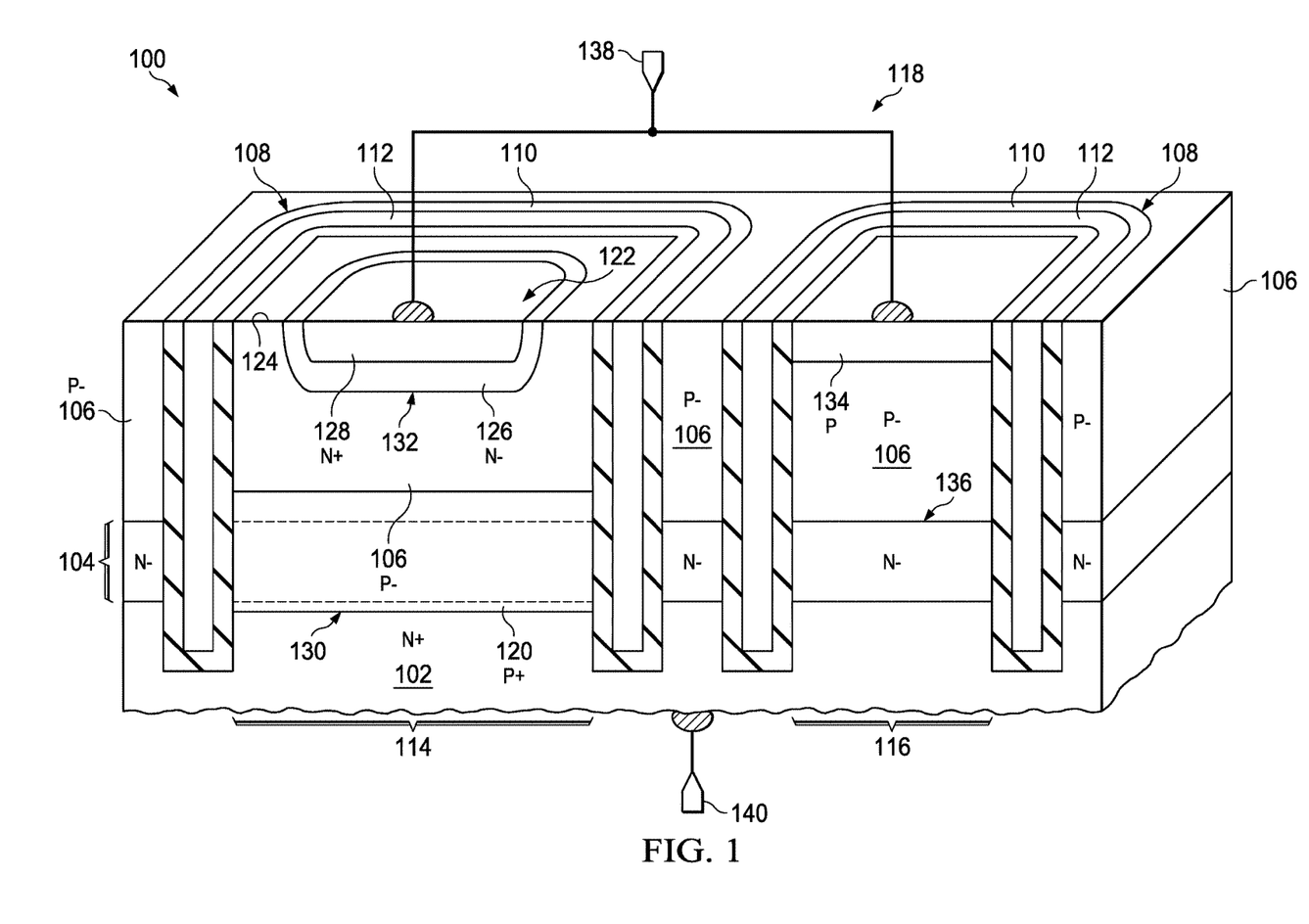
FIG. 1 is a cross section of an example semiconductor device with a bidirectional diode including an LR-LC diode.

FIG. 1 is a cross section of an example semiconductor device with a bidirectional diode including an LR-LC diode.

The semiconductor device 100 includes an n-type substrate 102. The n-type substrate 102 has an average dopant density greater than $1 \times 10^{18}$ cm$^{-3}$. The substrate 102 may be, for example, part of a bulk silicon wafer. The semiconductor device 100 includes a lightly-doped n-type layer 104 of silicon-based semiconductor material, for example phosphorus-doped crystalline silicon, disposed on the substrate 102. The n-type layer 104 is 1 micron to 5 microns thick, and has an average dopant density less than $1 \times 10^{16}$ cm$^{-3}$. The n-type layer 104 may be an epitaxial layer formed on the substrate 102. The semiconductor device 100 includes a lightly-doped p-type layer 106 of silicon-based semiconductor material, for example boon-doped crystalline silicon, disposed on the n-type layer 104. The p-type layer 106 is 3 microns to 8 microns thick, and has an average dopant density less than $1 \times 10^{15}$ cm$^{-3}$. The p-type layer 106 may be an epitaxial layer formed on the n-type layer 104.

One or more isolation structures 108 laterally isolate an area for the LR-LC diode 114 and laterally isolate an area for a parallel diode 116. The isolation structures 108 may be deep trench isolation structures 108 with dielectric liners 110 and field plates 112 of polycrystalline silicon, referred to as polysilicon, on the dielectric liners 110, as depicted in FIG. 1. Other physical forms for the isolation structures 108 are within the scope of the instant example. The LR-LC diode 114 and the parallel diode 116 are components of the bidirectional diode 118.

A p-type buried layer 120 is disposed in the LR-LC diode 114, extending from the p-type layer 106 through the n-type layer 104 to the substrate 102. The n-type layer 104 is depicted in FIG. 1 with dashed lines in the p-type buried layer 120. The p-type buried layer 120 has a peak dopant density greater than $1 \times 10^{17}$ cm$^{-3}$. The p-type buried layer 120 may extend laterally across the LR-LC diode 114 as depicted in FIG. 1. An n-type region 122 is disposed in the LR-LC diode 114, in the p-type layer 106. The n-type region 122 may be an n-type well 122 extending to a top surface 124 of the p-type layer 106. The n-type region 122 may include a lighter-doped outer portion 126 at least 100 nanometers thick contacting the p-type layer 106 and a heavier-doped inner portion 128 under and around the lighter-doped outer portion 126. The lighter-doped outer portion 126 may have an average dopant density of, for example, $1 \times 10^{16}$ cm$^{-3}$ to $1 \times 10^{17}$ cm$^{-3}$. The heavier-doped inner portion 128 may have an average dopant density of, for example, $1 \times 10^{17}$ cm$^{-3}$ to $3 \times 10^{19}$ cm$^{-3}$.

A first pn junction 130 of the LR-LC diode 114 is at a boundary between the p-type buried layer 120 and the n-type substrate 102. A second pn junction 132 is at a boundary between the p-type layer 106 and the n-type region 122. The first pn junction 130 and the second pn junction 132 are in series.

A breakdown voltage of the LR-LC diode 114 is determined by both the dopant density of the p-type buried layer 120 and the dopant density of the substrate 102, at the first pn junction 130. Desired values of the dopant density of the p-type buried layer 120 and the dopant density of the substrate 102 at the first pn junction 130 may be attained by selecting appropriate values for the thickness of the n-type layer 104 and the peak dopant density of the p-type buried layer 120. Increasing the thickness of the n-type layer 104 will move the peak of the dopant distribution in the p-type buried layer 120 away from the substrate 102 and thus reduce the dopant density of the p-type buried layer 120 and the dopant density of the substrate 102 at the first pn junction 130, and thus increase the breakdown voltage. Conversely, increasing the peak dopant density of the p-type buried layer 120 will increase the dopant density of the p-type buried layer 120 and the dopant density of the substrate 102 at the first pn junction 130, and thus reduce the breakdown voltage.

If the dopant density of the p-type buried layer 120 and the dopant density of the substrate 102, at the first pn junction 130, are about $2 \times 10^{18}$ cm$^{-3}$ to about $5 \times 10^{18}$ cm$^{-3}$, the breakdown voltage may be 6 volts to 8 volts. This range for the breakdown voltage may be attained by the n-type substrate 102 having an average dopant density of $5 \times 10^{19}$ cm$^{-3}$ to $7 \times 10^{19}$ cm$^{-3}$, the n-type layer 104 having a thickness of 1.5 microns to 2.5 microns, and the p-type buried layer 120 having a peak dopant density of $5 \times 10^{18}$ cm$^{-3}$ to $1 \times 10^{19}$ cm$^{-3}$. Using the LR-LC diode 114 having the breakdown voltage of 6 volts to 8 volts in an ESD protection circuit may advantageously provide protection for a logic input/output terminal with an operating range of 3 volts to 5 volts.

If the dopant density of the p-type buried layer 120 and the dopant density of the substrate 102, at the first pn junction 130, are about $1 \times 10^{17}$ cm$^{-3}$ to about $5 \times 10^{17}$ cm$^{-3}$, the breakdown voltage may be 20 volts to 40 volts. This range for the breakdown voltage may be attained by the n-type substrate 102 having an average dopant density of $1 \times 10^{19}$ cm$^{-3}$ to $5 \times 10^{19}$ cm$^{-3}$, the n-type layer 104 having a thickness of 2.5 microns to 3.0 microns, and the p-type buried layer 120 having a peak dopant density of $5 \times 10^{17}$ cm$^{-3}$ to $2 \times 10^{18}$ cm$^{-3}$. Using the LR-LC diode 114 having the breakdown voltage of 20 volts to 40 volts in an ESD protection circuit may advantageously provide protection for an analog input/output terminal with an operating range of 10 volts to 25 volts.

A capacitance of the LR-LC diode 114 is predominantly determined by a capacitance of the second pn junction 132, which is affected by dopant densities of the p-type layer 106 and the n-type region 122 at the second pn junction 132. The n-type region 122 is separated from the p-type buried layer 120 by at least 2 microns, which provides a sufficient distance for a depletion region in the p-type layer 106 when the second pn junction 132 is reverse biased, and provides a suitably low ohmic resistance in the p-type layer 106 when the second pn junction 132 is forward biased.

A dynamic resistance of the LR-LC diode 114 is predominantly determined by the dopant density in the substrate 102. The average dopant density in the substrate 102 may exceed $5 \times 10^{19}$ cm$^{-3}$ to reduce the dynamic resistance. A desired value for the dopant density in the substrate 102, for example above $5 \times 10^{19}$ cm$^{-3}$, may advantageously be attained without degrading the breakdown voltage, because the breakdown voltage may be attained by selecting appropriate values for the thickness of the n-type layer 104 and the peak dopant density of the p-type buried layer 120, independently of the dopant density in the substrate 102. A lateral size of the LR-LC diode 114 is selected to provide a desired current capacity.

A p-type region 134, for example a p-type well 134, is disposed in the p-type layer 106 in the parallel diode 116, extending to the top surface 124 of the p-type layer 106. There is at least a micron of vertical separation between the p-type region 134 and the n-type layer 104. The p-type region 134 may extend across the parallel diode 116 as depicted in FIG. 1, or may be recessed from the isolation structures 108. The p-type region 134 has an average dopant density of at least $1 \times 10^{17}$ cm$^{-3}$ and may provide a desired low resistance contact to the parallel diode 116. A third pn junction 136 of the parallel diode 116 is at a boundary of the n-type layer 104 and the p-type layer 106. The p-type buried layer 120 in the LR-LC diode 114 does not extend into the parallel diode 116. A breakdown voltage of the third pn junction 136 is significantly higher than the breakdown voltage of the first pn junction 130 of the LR-LC diode 114, due to the lower dopant densities of the n-type layer 104 and the p-type layer 106 compared to the dopant densities of the p-type buried layer 120 and the substrate 102. A capacitance of the parallel diode 116 is determined by the dopant densities of the n-type layer 104 and the p-type layer 106 at the third pn junction 136 and may be comparable to the capacitance of the LR-LC diode 114. The capacitances of the LR-LC diode 114 and the parallel diode 116 are advantageously low due to the low dopant densities of the n-type layer 104 and the p-type layer 106, compared to diodes with higher dopant densities. A dynamic resistance of the parallel diode 116 is predominantly determined by the dopant density in the substrate 102. Having dopant density in the substrate 102 above $1\times10^{18}$ cm$^{-3}$, and particularly above $5\times10^{19}$ cm$^{-3}$, may advantageously provide a desired low dynamic resistance.

A first terminal 138 of the bidirectional diode 118 is electrically connected to the n-type region 122 of the LR-LC diode 114 and to the p-type region 134 of the parallel diode 116. The first terminal 138 may be integrated into the semiconductor device 100, or may be comprised of separate external connections such as wire bonds or bump bonds. A second terminal 140 is electrically connected to the substrate 102, possibly comprising solder or an electrically conductive die attach material. During operation of the bidirectional diode 118, a voltage excursion which is positive on the first terminal 138 relative to the second terminal 140 forward biases the parallel diode 116 and is thus shunted through the parallel diode 116. A voltage excursion which is negative on the first terminal 138 relative to the second terminal 140 forward biases the second pn junction 132 and causes breakdown in the first pn junction 130 in the LR-LC diode 114 and is thus shunted through the LR-LC diode 114.

Figure 2A:
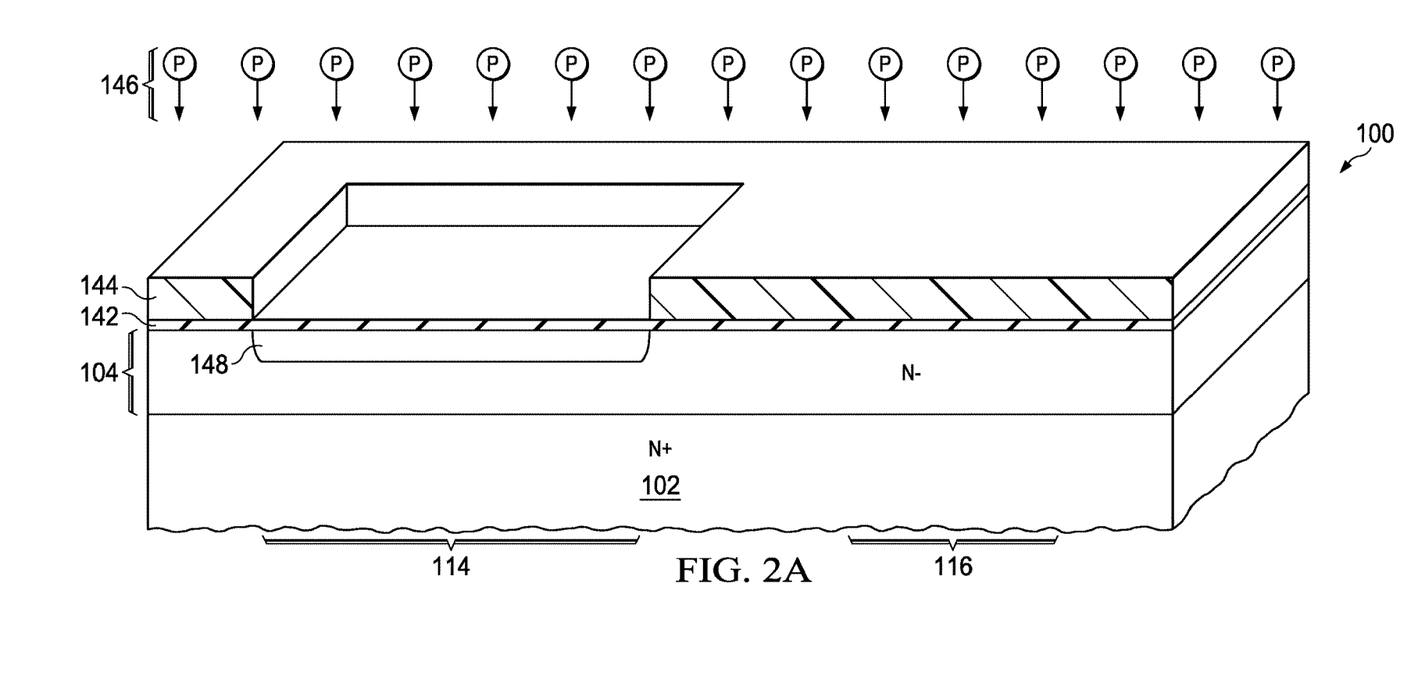
FIG. 2A through FIG. 2E are cross sections of the semiconductor device of FIG. 1, depicted in successive stages of an example method of formation.

FIG. 2A through FIG. 2E are cross sections of the semiconductor device of FIG. 1, depicted in successive stages of an example method of formation. Referring to FIG. 2A, the substrate 102 is provided with an average dopant density greater than $1\times10^{18}$ cm$^{-3}$. The dopants may include phosphorus and arsenic and possibly antimony. The average dopant density may exceed $5\times10^{19}$ cm$^{-3}$ to advantageously reduce the dynamic resistance of the bidirectional diode 118 of FIG. 1. The n-type layer 104 is formed on the substrate 102 by an epitaxial process, for example by thermal decomposition of silane at 550° C. N-type dopants such as phosphorus from the substrate 102 diffuse into the n-type layer 104 during the epitaxial process. Additional n-type dopants, such as phosphorus and/or arsenic in the form of phosphine and/or arsine, may be introduced into the n-type layer 104 during the epitaxial process. An average dopant density from all sources in the n-type layer 104 is less than $1\times10^{16}$ cm$^{-3}$. The thickness of the n-type layer 104 is selected from 1 micron to 5 microns, to provide a desired breakdown voltage of the first pn junction 130 of FIG. 1, as explained above.

A first layer of pad oxide 142 may be formed on the n-type layer 104. The first layer of pad oxide 142 may be formed by thermal oxidation, and may be 5 nanometers to 50 nanometers thick. The layer of pad oxide 142 protects the surface of the n-type layer during subsequent processing. A first implant mask 144 is formed over the first layer of pad oxide 142 which exposes an area in the LR-LC diode 114 for the p-type buried layer 120 of FIG. 1. The first implant mask 144 covers the area for the parallel diode 116. The first implant mask 144 may include photoresist formed by a photolithographic process and may include hard mask material such as silicon dioxide or silicon nitride. A first set of p-type dopants 146 such as boron, and possibly gallium or indium, are implanted into the n-type layer 104 in the area exposed by the first implant mask 144 to form a buried layer implanted region 148 in the n-type layer 104 immediately under the layer of pad oxide 142. The layer of pad oxide 142 reduces channeling of the implanted p-type dopants 146, limiting the depth of the buried layer implanted region 148, which may advantageously provide a more reproducible dopant distribution in the p-type buried layer 120 and thus a more consistent breakdown voltage in the first pn junction 130. The p-type dopants 146 may have a dose of at least $3\times10^{13}$ cm$^{-2}$ to provide the peak dopant density greater than $1\times10^{17}$ cm$^{-3}$. To provide a peak dopant density of $5\times10^{18}$ cm$^{-3}$ to $1\times10^{19}$ cm$^{-3}$, as described in the example of the LR-LC diode 114 having the breakdown voltage of 6 volts to 8 volts disclosed in reference to FIG. 1, the p-type dopants 146 may have a dose of $6\times10^{14}$ cm$^{-2}$ to $2\times10^{15}$ cm$^{-2}$. To provide a peak dopant density of $5\times10^{17}$ cm$^{-3}$ to $2\times10^{18}$ cm$^{-3}$, as described in the example of the LR-LC diode 114 having the breakdown voltage of 20 volts to 40 volts disclosed in reference to FIG. 1, the p-type dopants 146 may have a dose of $6\times10^{13}$ cm$^{-2}$ to $3\times10^{14}$ cm$^{-2}$.

After the p-type dopants 146 are implanted, the first implant mask 144 is removed. Photoresist in the first implant mask 144 may be removed by an ash process followed by a wet clean using an aqueous mixture of sulfuric acid and hydrogen peroxide, or an aqueous mixture of ammonium hydroxide and hydrogen peroxide. Silicon nitride in the first implant mask 144 may be removed by a plasma etch process.

An anneal process activates the implanted p-type dopants 146 in the buried layer implanted region 148. The anneal process may be a rapid thermal process, for one example, which heats the substrate 102 and n-type layer 104 to a temperature of 1000° C. to 1050° C. for 20 seconds to 60 seconds, or may be a furnace anneal, for another example, which heats the substrate 102 and n-type layer 104 to a temperature of 850° C. to 950° C. for 30 minutes to 120 minutes. The first layer of pad oxide 142 is subsequently removed, for example by a dilute aqueous buffered solution of hydrofluoric acid.

Figure 2B:
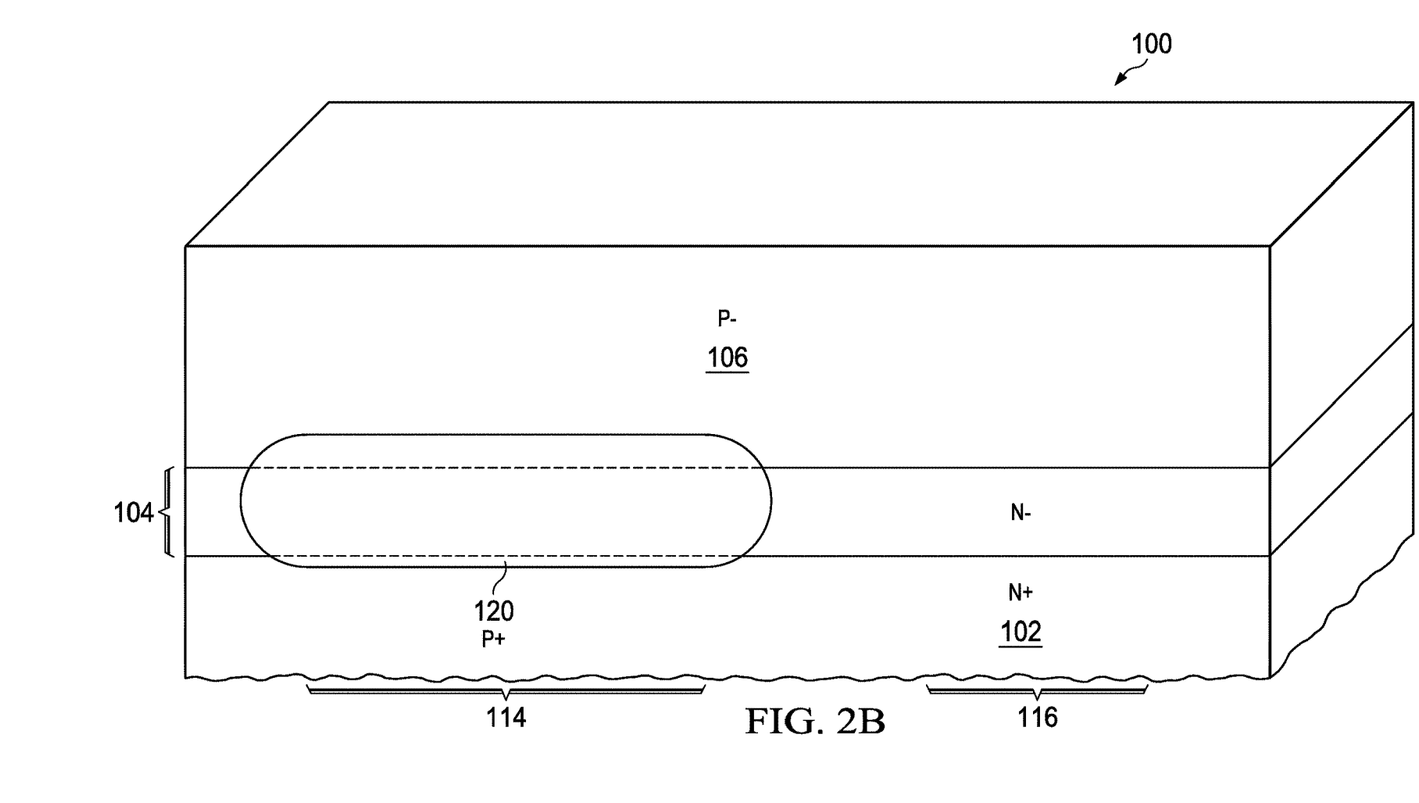

Referring to FIG. 2B, the p-type layer 106 is formed on the n-type layer 104 by another epitaxial process. P-type dopants, such as boron in the form of borane, are introduced into the p-type layer 106 during the epitaxial process to provide an average dopant density less than $1\times10^{15}$ cm$^{-3}$. The thickness of the p-type layer 106 is selected from 3 microns to 8 microns to provide the desired low capacitance for the second pn junction 132 of FIG. 1 while maintaining the desired low dynamic resistance for the LR-LC diode 114. During the epitaxial process to form the p-type layer 106, the p-type dopants of the buried layer implanted region 148 of FIG. 2A diffuse upward into the p-type layer 106 and downward to contact the substrate 102, to form the p-type buried layer 120. The p-type dopants of the p-type buried layer 120 counterdope the n-type layer 104 in the area for the LR-LC diode 114. The n-type layer 104 is depicted with dashed lines in the p-type buried layer 120 in FIG. 2B through FIG. 2E.

Figure 2C:
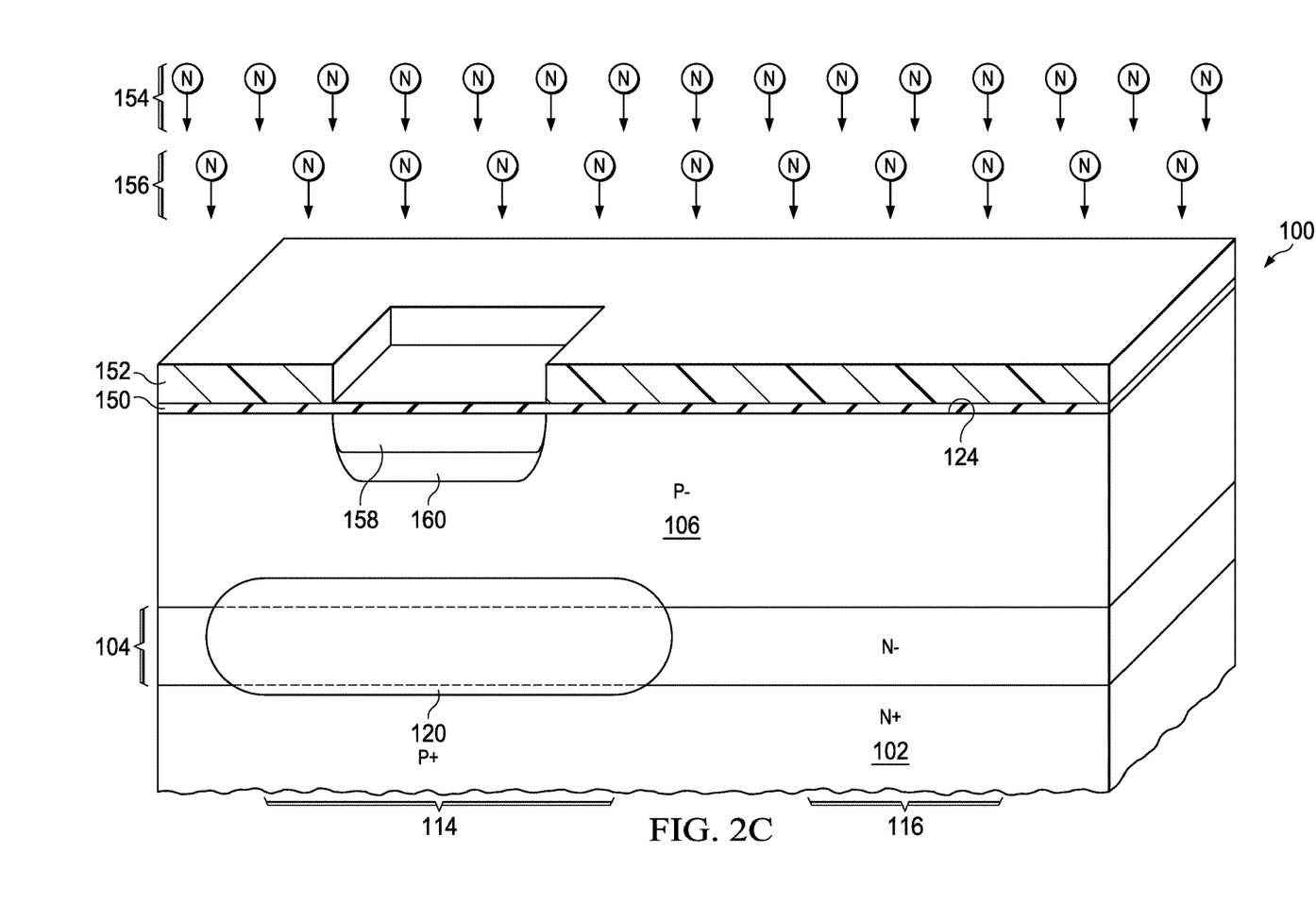

Referring to FIG. 2C, a second layer of pad oxide 150 may be formed over the top surface 124 of the p-type layer 106 to protect the top surface 124 during subsequent processing. The second layer of pad oxide 150 may be formed similarly to the first layer of pad oxide 142 described in reference to FIG. 2A. A second implant mask 152 is formed over the second layer of pad oxide 150 so as to expose an area in the LR-LC diode 114 for the n-type region 122 of FIG. 1. The second implant mask 152 covers the area for the parallel diode 116. The second implant mask 152 may be include photoresist formed by a photolithographic process. A first set of n-type dopants 154, including phosphorus and arsenic and possibly antimony, is implanted into the p-type layer 106 in the area exposed by the second implant mask 152 to form a first n-type implanted region 158 in the p-type layer 106 immediately below the second layer of pad oxide 150. The first set of n-type dopants 154 may have a total dose of, for example, $1 \times 10^{15}$ cm$^{-2}$ to $1 \times 10^{16}$ cm$^{-2}$ and an energy to provide an average depth of 50 nanometers to 200 nanometers, to provide the n-type dopants for the heavier-doped inner portion 128 of the n-type region 122 of FIG. 1. A second set of n-type dopants 156 including phosphorus, is implanted into the p-type layer 106 in the area exposed by the second implant mask 152 to form a second n-type implanted region 160 in the p-type layer 106 immediately below the first n-type implanted region 158. The second set of n-type dopants 154 may have a total dose of, for example, $1 \times 10^{13}$ cm$^{-2}$ to $1 \times 10^{14}$ cm$^{-2}$ and an energy of, for example, 250 keV to 600 keV for the phosphorus, to provide the n-type dopants for the lighter-doped inner portion 126 of the n-type region 122 of FIG. 1. Subsequently, the second implant mask 152 is removed, for example as described in reference to the first implant mask 144 of FIG. 2A.

Figure 2D:
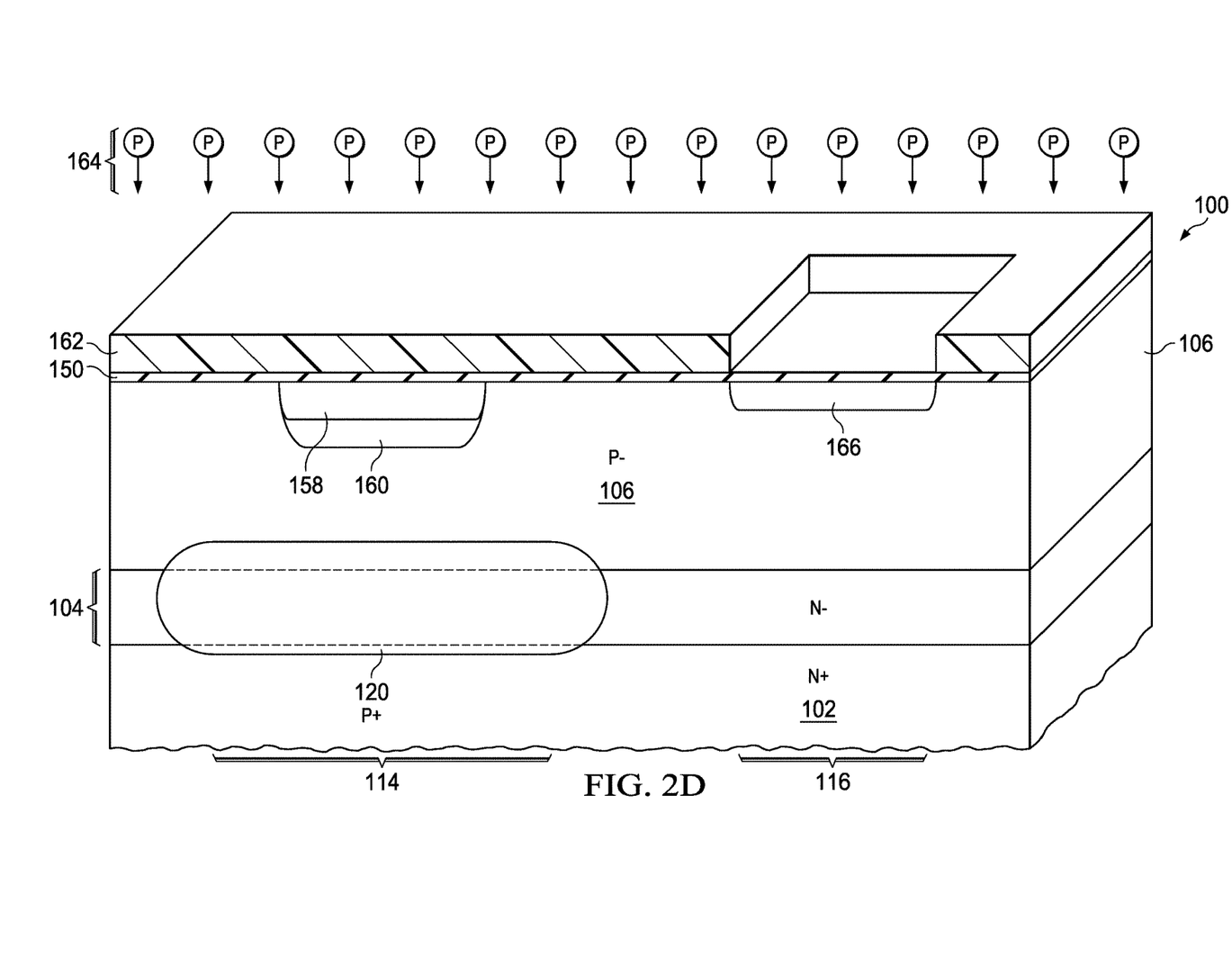

Referring to FIG. 2D, a third implant mask 162 is formed over the second layer of pad oxide 150 so as to expose an area in the parallel diode 116 for the p-type region 134 of FIG. 1. The third implant mask 162 covers the area for the LR-LC diode 114. The third implant mask 162 may be formed similarly to the second implant mask 152 of FIG. 2C. A second set of p-type dopants 164 is implanted into the p-type layer 106 in the area exposed by the third implant mask 162 to form a p-type well implanted region 166 in the p-type layer 106 immediately below the second layer of pad oxide 150. The p-type dopants 164 may have a total dose of, for example, $1 \times 10^{15}$ cm$^{-2}$ to $1 \times 10^{16}$ cm$^{-2}$. Subsequently, the third implant mask 162 is removed, for example as described in reference to the first implant mask 144 of FIG. 2A.

Figure 2E:
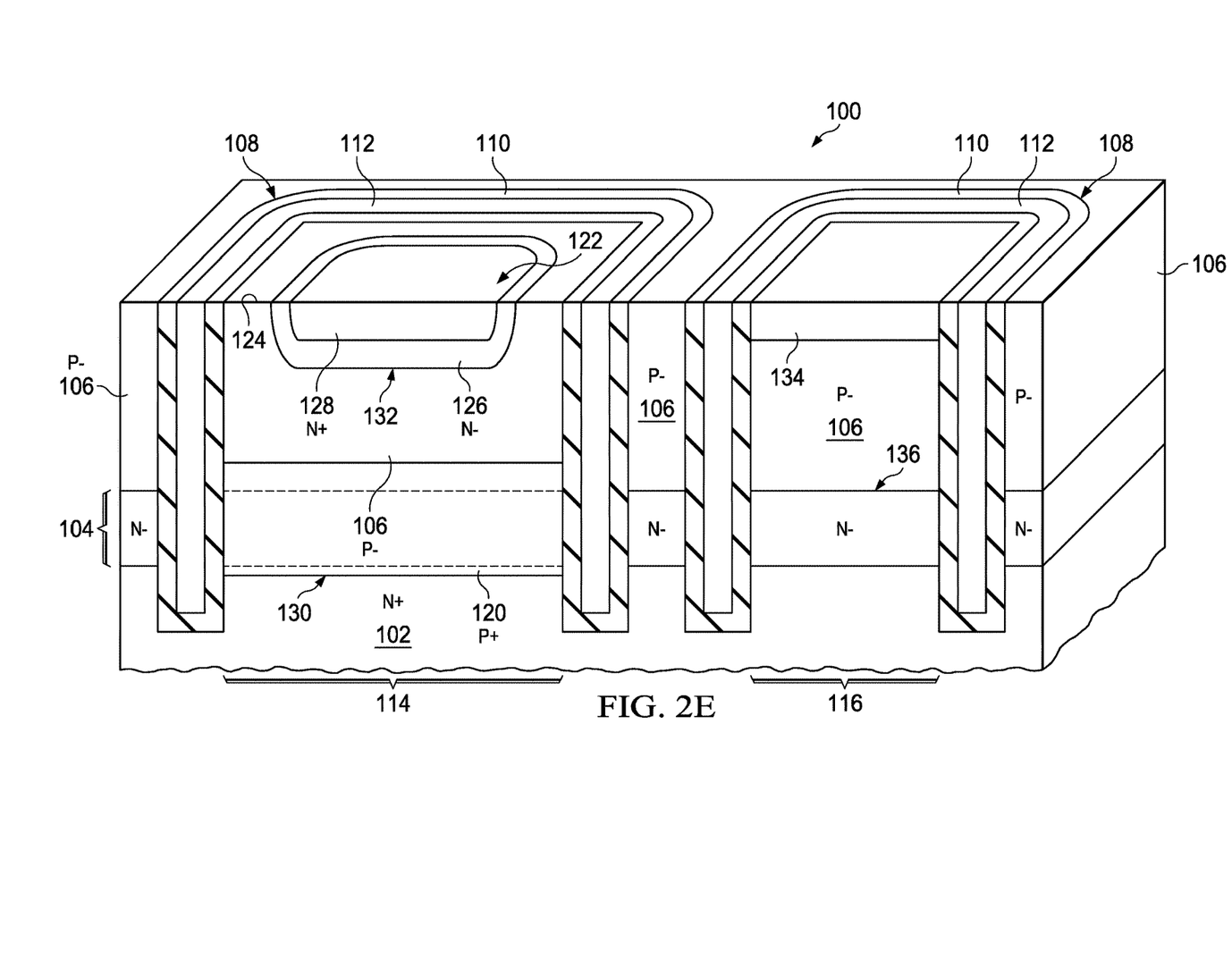

Referring to FIG. 2E, the isolation structures 108 are formed through the p-type layer 106 and the n-type layer 104, extending into the substrate 102, so as to laterally surround the area for the LR-LC diode 114 and also to laterally surround the area for the parallel diode 116. The isolation structures 108 may be formed by etching isolation trenches through the p-type layer 106 and the n-type layer 104 and into the substrate 102 below the p-type buried layer 120. A layer of thermal oxide may be grown on sidewalls and bottoms of the isolation trenches, possibly followed by a conformal layer of silicon dioxide over the top surface 124 of the p-type layer 106 and extending into the isolation trenches on the thermal oxide, formed by a sub-atmospheric chemical vapor deposition (SACVD) process. The layer of thermal oxide and the layer of SACVD silicon dioxide provide the dielectric liner 110 of the isolation structures 108. A layer of polysilicon is formed on the SACVD silicon dioxide, extending into the isolation trenches to form the field plates 112. The polysilicon and the SACVD silicon dioxide are removed from over the top surface 124 of the p-type layer 106, by an etchback process and/or a chemical mechanical polish (CMP) process, leaving the isolation structures 108. A thermal profile during growth of the thermal oxide in the dielectric liner 110 activates and diffuses the implanted n-type dopants in the first n-type implanted region 158 and the second n-type implanted region 160 of FIG. 2C to form the heavier-doped inner portion 128 and the lighter-doped inner portion 126, respectively, of the n-type region 122, and activates and diffuses the implanted p-type dopants in the p-type well implanted region 166 of FIG. 2D to form the p-type region 134. An optional thermal drive process such as a furnace anneal may be performed to further diffuse the implanted n-type dopants and the implanted p-type dopants, either before or after formation of the isolation structures 108.

Other methods of forming the isolation structures 108 are within the scope of the instant example, possibly combined with other methods of activating and diffusing the implanted n-type dopants and p-type dopants, such as a furnace anneal. Formation of the semiconductor device 100 continues with formation of electrical connections to the substrate 102, the n-type region 122 and the p-type region 134 to provide the structure of FIG. 1.

Figure 3:
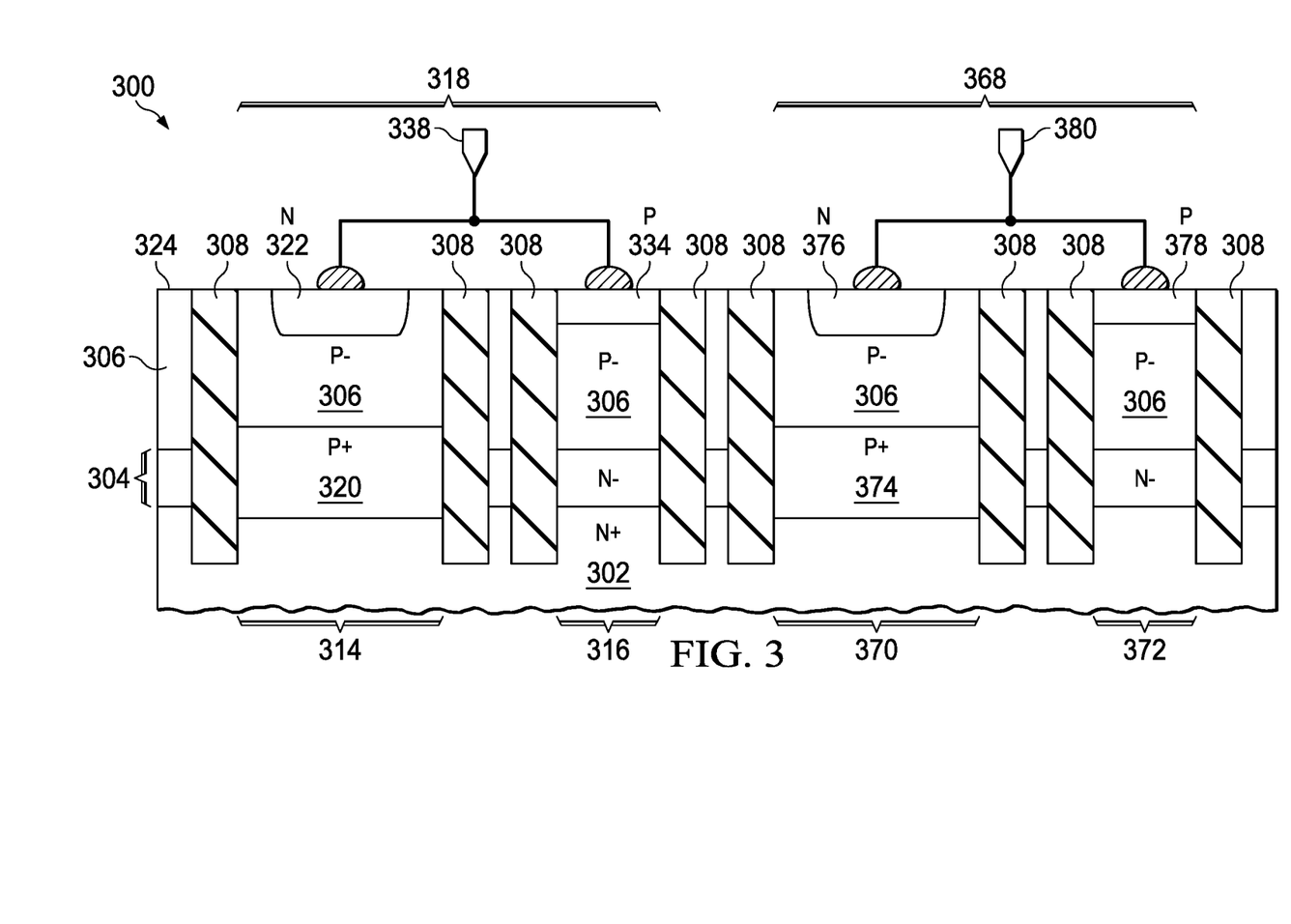
FIG. 3 is a cross section of another example semiconductor device with a pair of bidirectional diodes including LR-LC diodes.

FIG. 3 is a cross section of another example semiconductor device with a pair of bidirectional diodes including LR-LC diodes. The semiconductor device 300 includes a first bidirectional diode 318 and a second bidirectional diode 368. The first bidirectional diode 318 includes a first LR-LC diode 314 and a first parallel diode 316; the second bidirectional diode 368 includes a second LR-LC diode 370 and a second parallel diode 372. The first LR-LC diode 314, the first parallel diode 316, the second LR-LC diode 370 and the second parallel diode 372 are laterally separated by isolation structures 308. The isolation structures 308 may be deep trench structures as described in reference to FIG. 1, or may be other types of isolation structures.

The semiconductor device 300 is formed on an n-type substrate 302 having an average dopant density greater than $1 \times 10^{18}$ cm$^{-3}$, as described in reference to FIG. 1 and FIG. 2A. The first bidirectional diode 318 and the second bidirectional diode 368 share the n-type substrate 302. An n-type layer 304 1 micron to 5 microns thick, with an average dopant density less than $1 \times 10^{16}$ cm$^{-3}$, is formed on the substrate 302. The n-type layer 304 may be formed by an epitaxial process. A p-type layer 306 3 microns to 8 microns thick, with an average dopant density less than $1 \times 10^{15}$ cm$^{-3}$, is formed on the n-type layer 304. The p-type layer 306 may also be formed by an epitaxial process. Other methods of forming the n-type layer 304 and the p-type layer 306 are within the scope of the instant example.

The first LR-LC diode 314 includes a first p-type buried layer 320 extending from the p-type layer 306 through the n-type layer 304 to the substrate 302. The first p-type buried layer 320 has a peak dopant density greater than $1 \times 10^{17}$ cm$^{-3}$. The first buried p-type layer 320 is localized to the first LR-LC diode 314. The first LR-LC diode 314 also includes a first n-type region 322 with an average dopant density of, for example, $1 \times 10^{16}$ cm$^{-3}$ to $3 \times 10^{19}$ cm$^{-3}$, disposed in the p-type layer 306, extending to a top surface 324 of the p-type layer 306. The first LR-LC diode 314 operates as described in reference to FIG. 1.

The first parallel diode 316 includes a first p-type region 334 disposed in the p-type layer 306, extending to the top surface 324 of the p-type layer 306. The first parallel diode 316 is free of p-type buried layers such as the first p-type buried layer 320. The first parallel diode 316 operates as part of the first bidirectional diode 318, as described in reference to FIG. 1.

The second LR-LC diode 370 is similar to the first LR-LC diode 314. The second LR-LC diode 370 includes a second p-type buried layer 374 extending from the p-type layer 306 through the n-type layer 304 to the substrate 302. The second p-type buried layer 374 may be formed concurrently with the first p-type buried layer 320, so that a peak dopant density of the second p-type buried layer 374 is equal to the peak dopant density of the first p-type buried layer 320. The second p-type buried layer 374 is localized to the second LR-LC diode 370. The second LR-LC diode 370 also includes a second n-type region 376 disposed in the p-type layer 306, extending to the top surface 324 of the p-type layer 306. The second n-type region 376 may be formed concurrently with the first n-type region 322, so that a dopant density distribution of the second n-type region 376 is equal to a dopant density distribution of the first n-type region 322. The second LR-LC diode 370 operates similarly to the first LR-LC diode 314.

The second parallel diode 372 is similar to the first parallel diode 316. The second parallel diode 372 includes a second p-type region 378 disposed in the p-type layer 306, extending to the top surface 324 of the p-type layer 306. The second p-type region 378 may be formed concurrently with the first p-type region 334, so that an average dopant density of the second p-type region 378 is equal to the average dopant density of the first p-type region 334. The second parallel diode 372 is also free of p-type buried layers such as the second p-type buried layer 374. The second parallel diode 372 operates as part of the second bidirectional diode 368, similarly to the first bidirectional diode 318.

A first terminal 338 of the semiconductor device 300 is directly electrically coupled to the first n-type region 322 and the first p-type region 334. A second terminal 380 of the semiconductor device 300 is directly electrically coupled to the second n-type region 376 and the second p-type region 378. During operation of the semiconductor device 300, a voltage excursion between the first terminal 338 and the second terminal 380 produces current flow through the first bidirectional diode 318 and the second bidirectional diode 368. The back-to-back configuration of the first bidirectional diode 318 and the second bidirectional diode 368 may advantageously provide a symmetric shunting response to the voltage excursions. The back-to-back configuration of the first bidirectional diode 318 and the second bidirectional diode 368 may also advantageously provide a higher effective breakdown voltage than a single bidirectional diode with the same structure.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A device, comprising:
an n-type substrate;
an n-type layer above the n-type substrate;
a p-type layer having a first dopant concentration and located above the n-type layer;
a p-type region having a second dopant concentration higher than the first dopant concentration and extending through the n-type layer;
an n-type region in the p-type layer and extending to a surface of the p-type layer; and
an isolation structure extending from the surface of the p-type layer to the n-type substrate, and isolating the p-type region from a remaining portion of the n-type layer outside the isolation structure.

2. The device of claim 1, wherein the n-type substrate has a third dopant concentration, and the n-type layer has a fourth dopant concentration lower than the third dopant concentration.

3. The device of claim 1, wherein the p-type region interfaces with the p-type layer.

4. The device of claim 1, wherein the n-type layer has a first thickness, and the p-type region has a second thickness greater than the first thickness.

5. The device of claim 1, wherein:
the n-type layer has a top boundary facing away from the n-type substrate, and a bottom boundary interfacing the n-type substrate; and
the p-type region has a top portion extending above the top boundary of the n-type layer, a middle portion coplanar with the n-type layer, and a bottom portion extending below the bottom boundary of the n-type layer.

6. The device of claim 1, further comprising:
a first diode structure having a first pn junction across the n-type region and the p-type layer, and a second pn junction across the p-type region and the n-type substrate; and
a second diode structure having a third pn junction across the p-type layer and the n-type layer.

7. The device of claim 6, wherein the isolation structure includes:
a first trench laterally surrounding the first diode structure; and
a second trench laterally surrounding the second diode structure.

8. The device of claim 6, further comprising:
a first terminal electrically coupled to the n-type region in the first diode structure, and electrically coupled to the p-type layer in the second diode structure; and
a second terminal electrically coupled to the n-type substrate.

9. A device, comprising:
an n-type substrate having a first diode region and a second diode region;
a first p-type layer above the n-type substrate within the first diode region;
an n-type layer above the n-type substrate within the second diode region;
a second p-type layer, above and interfacing the first p-type layer within the first diode region, and above and interfacing the n-type layer outside the first diode region, the second p-type layer extending within and across the first diode region and the second diode region; and
an n-type region in the second p-type layer and extending to a surface of the second p-type layer.

10. The device of claim 9, further comprising:
an isolation structure extending from the surface of the second p-type layer to the n-type substrate, the isolation structure laterally isolating:
a first pn junction across the n-type region and the second p-type layer; and
a second pn junction across the first p-type layer and the n-type substrate.

11. The device of claim 9, further comprising:
an isolation structure extending from the surface of the second p-type layer to the n-type substrate, the isolation structure laterally isolating a pn junction across the second p-type layer and the n-type layer.

12. The device of claim 9, wherein the first p-type layer has a higher dopant concentration than the second p-type layer.

13. The device of claim 9, wherein the n-type substrate has a higher dopant concentration than the n-type layer.

14. The device of claim 9, wherein an inner portion of the first p-type layer is coplanar with the n-type layer, and the first p-type layer has a greater thickness than the n-type layer.

15. A device, comprising:
   an n-type substrate;
   an n-type layer above the n-type substrate and having a lower dopant concentration than the n-type substrate;
   a p-type layer above the n-type layer;
   a p-type region extending through the n-type layer and interfacing the n-type substrate and the p-type layer, the p-type region having a higher dopant concentration than does the p-type layer; and
   a first isolation trench laterally surrounding the p-type region.

16. The device of claim 15, wherein the p-type region has a greater thickness than the n-type layer.

17. The device of claim 15, further comprising:
   a first diode structure having a first pn junction across the p-type region and the n-type substrate; and
   a second diode structure having a second pn junction across the p-type layer and the n-type layer.

18. The device of claim 17, further comprising:
   an n-type region in the p-type layer and above the p-type region,
   wherein the first diode structure has a third pn junction across the n-type region and the p-type layer.

19. The device of claim 17, wherein:
   the first isolation trench laterally surrounds the first diode structure.

20. The device of claim 17, further comprising:
   a second isolation trench laterally surrounding the second diode structure.

\* \* \* \* \*